United States Patent [19]

Goodchild

[11] Patent Number: 4,677,319

[45] Date of Patent: Jun. 30, 1987

[54] ELECTRICAL CIRCUIT FOR INTERFACING HIGH FREQUENCY SIGNALS TO THE LOGIC LEVELS OF ANY LOGIC FAMILY HAVING A SWITCHING VOLTAGE AT THE MEAN OF THE "0" AND "1" VOLTAGES

[75] Inventor: Gath Goodchild, Billericay, England

[73] Assignee: Standard Telephones and Cables Public Limited Company, London, England

[21] Appl. No.: 914,573

[22] Filed: Oct. 3, 1986

Related U.S. Application Data

[63] Continuation of Ser. No. 622,762, Jun. 20, 1984, abandoned.

[30] Foreign Application Priority Data

Jun. 25, 1983 [GB] United Kingdom ............... 8317330

[51] Int. Cl.[4] .................. H03K 3/017; H03K 5/01; H03K 5/04
[52] U.S. Cl. .................... 307/475; 307/443; 307/261; 307/265; 307/268
[58] Field of Search .............. 307/443, 445, 455, 475, 307/479, 519, 234, 261, 265; 328/164; 333/22 R; 455/610, 612

[56] References Cited

U.S. PATENT DOCUMENTS

| | | | |
|---|---|---|---|
| 3,530,313 | 9/1970 | Gassmann | 307/261 |
| 3,586,885 | 6/1971 | Dudley | 307/261 X |
| 3,721,835 | 3/1973 | Hess | 307/264 |
| 3,983,496 | 9/1976 | Bedford et al. | 307/290 X |
| 3,999,083 | 12/1976 | Bumgardner | 328/147 |
| 4,034,240 | 7/1977 | Foreman | 307/261 X |
| 4,110,698 | 8/1978 | Petrie | 307/268 X |
| 4,121,095 | 10/1978 | Endersz et al. | 328/164 |
| 4,239,992 | 12/1980 | Perkins | 307/265 |
| 4,263,555 | 4/1981 | Hunka | 307/264 |
| 4,414,480 | 11/1983 | Zasio | 307/443 |
| 4,450,370 | 5/1984 | Davis | 307/475 |
| 4,461,962 | 7/1984 | Hacke et al. | 307/359 |
| 4,553,050 | 11/1985 | Feinberg et al. | 307/443 |

FOREIGN PATENT DOCUMENTS 1218511  1/1971  United Kingdom .

OTHER PUBLICATIONS

Toute l'Electronique, No. 457, Oct. 1980, pp. 81–86, Paris, FR: "Applications et Circuits".

L'Onde Electrique, vol. 45, No. 457, Apr. 1965, pp. 476–484, Paris, FR; J. Mey: "Techniques Actuelles et Perspectives de l'Électronique Nucléaire Rapide".

Primary Examiner—Stanley D. Miller
Assistant Examiner—David R. Bertelson
Attorney, Agent, or Firm—Kerkam, Stowell, Kondracki & Clarke

[57] ABSTRACT

An interface circuit, particularly for use between a high frequency sine wave and ECL (emitter-coupled logic) logic levels, which has an almost resistive input inpedance. The circuit may comprise an ECL OR/NOR gate (3) with the complementary outputs thereof having respective feedback paths (R2,R1; R3,R1). The high frequency sine wave is supplied via a coaxial cable (4) which is terminated via resistor R1. The feedback resistors R2 and R3 are of the same value. The mark-to-space ratio at the gate outputs is substantially maintained at 50/50. The gate may be AND/NAND rather than OR/NOR. The interface circuit is applicable to any logic family having a switching voltage at the mean of the "0" and "1" voltages.

3 Claims, 6 Drawing Figures

ELECTRICAL CIRCUIT FOR INTERFACING HIGH FREQUENCY SIGNALS TO THE LOGIC LEVELS OF ANY LOGIC FAMILY HAVING A SWITCHING VOLTAGE AT THE MEAN OF THE "0" AND "1" VOLTAGES

CROSS-REFERENCE TO RELATED APPLICATION

This is a continuation of co-pending application Ser. No. 622,762, filed June 20, 1984, and now abandoned.

BACKGROUND OF THE INVENTION

This invention relates to circuits for interfacing high frequency signals to logic levels and in particular, but not exclusively, to interfacing high frequency signals to ECL (emitter-coupled logic) logic levels and to an ECL clock drive circuit.

The conventional way to interface a high frequency sine wave to ECL logic levels is to use feedback around an inverting gate 1 (FIG. 1) to provide the required $V_{BB}$ d.c. bias of the input to the inverting gate. The resistor R terminates an input coaxial cable 2, whilst the choke L prevents high frequency loop gain and the resistor $R_f$ damps any tendency to oscillate at low frequency. The disadvantage of this configuration is that the input impedance is far from ideal, due to the choke L in the feedback path, particularly for use in transmission systems operating above 100 Mbits/sec.

SUMMARY OF THE INVENTION

According to the present invention there is provided an electrical circuit for interfacing high frequency signals to the logic levels of any logic family having a switching voltage at the mean of the 0 and "1" voltages, including an OR/NOR or AND/NAND gate to whose input a high frequency signal is supplied in use of the circuit, and including a respective resistive feedback path for each of the complementary outputs of the gate.

According to another aspect of the present invention there is provided a digital telecommunications transmission equipment for signals having a bit rate in excess of 100 Mbits/sec, including means for extracting a clock signal from the received signal, circuit means for processing the data signal, characterised by an interface circuit for interfacing the extracted clock signal to the logic level of the processing circuit having a switching voltage at the mean of the "0" and "1" voltages, the interface circuit comprising a gate having complementary outputs and a respective feedback path for each output whereby to tend to maintain a 50/50 mark-to-space ratio and present a substantially resistive input impedance.

BRIEF DESCRIPTION OF THE DRAWINGS

Embodiments of the present invention will now be described with reference to FIGS. 2 to 6 of the accompanying drawings, in which.

DESCRIPTION OF THE PREFERRED EMBODIMENTS

Figure 2:
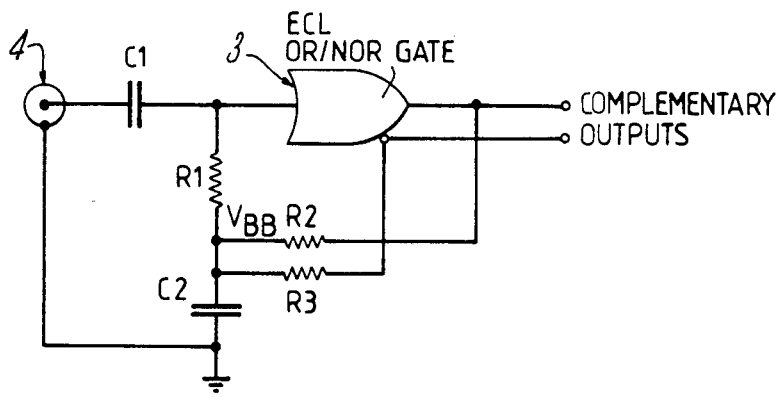
FIG. 2 is a circuit diagram of one interface circuit of the present invention.

The circuit illustrated in FIG. 2 is based on an ECL OR/NOR gate 3 having a pair of complementary outputs. A capacitor C1 serves to couple a high frequency signal, for example of sine waveform, transmitted via a coaxial cable 4 to the input of gate 3. A resistor R1 which serves to terminate the coaxial cable 4 is coupled to earth via a capacitor C2.

The capacitor C2 also serves to store the $V_{BB}$ d.c. bias voltage which is applied to the input of the gate 3 through the resistor R1. Feedback resistors R2 and R3 are connected from each of the complementary outputs of the gate 3 (which outputs may carry ECL clock signals) to the capacitor C2. The feedback resistors R2 and R3 are of substantially the same resistance value, typically 470 ohms. These feedback resistors R2 and R3 will be seen to comprise a voltage divider which inherently maintains the $V_{BB}$ d.c. bias voltage stored in the capacitor C2 at the mean of the voltages corresponding to the actual "0" and "1" logic levels at the outputs of the gate 3.

When the input signal is a sine wave, or even a distorted sine wave, the circuit substantially maintains a 50/50 mark-to-space ratio of the signals at the gate outputs. This result follows because the circuit ensures that the $V_{BB}$ d.c. bias voltage is maintained at the mean of the "0" and "1" logic voltage levels.

Figure 1:
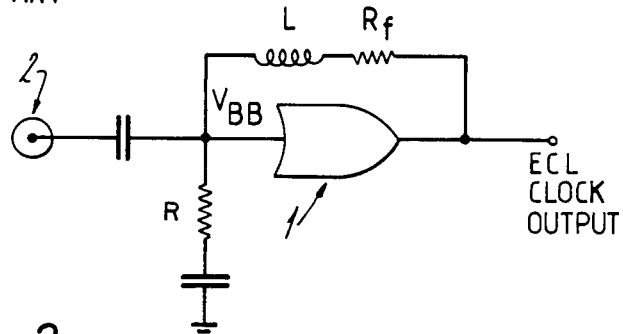

Another advantage of the circuit of FIG. 2 is that its input impedance is almost resistive and therefore more ideal than that of the conventional circuit shown in FIG. 1.

Whilst the circuit of FIG. 2 employs an ECL OR/NOR gate, an ECL AND/NAND gate may alternatively be employed. The basic principle may also be applied to logic familys, other than ECL, provided that the other logic family has a switching voltage at the mean of the "0" and "1" voltages.

Figure 3:
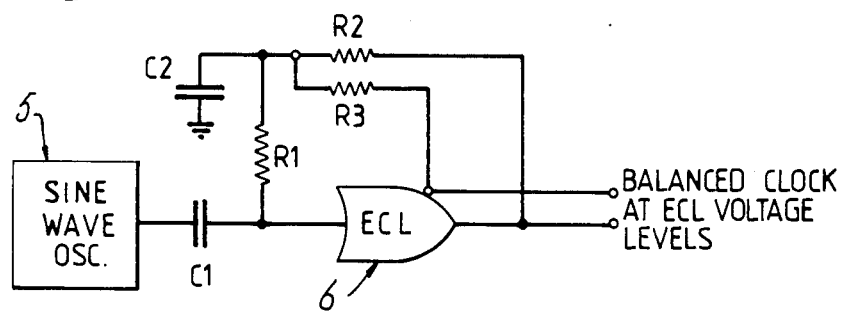
FIG. 3 is a circuit diagram of another interface circuit of the present invention.

The circuit illustrated in FIG. 3 is equivalent to that of FIG. 2 and incorporates a sine wave oscillator 5 instead of the coaxial cable 4. Such a circuit may be used whenever a sine wave is required to be used in an ECL system as a clock, and it interfaces the sine wave into the system at the correct 0 and "1" levels. The circuit has gain, from the gate 6, so that the input sine wave can vary in amplitude and still be interfaced correctly. The actual tolerable variation is a function of the operating frequency and the speed of the gate used.

Figure 4:
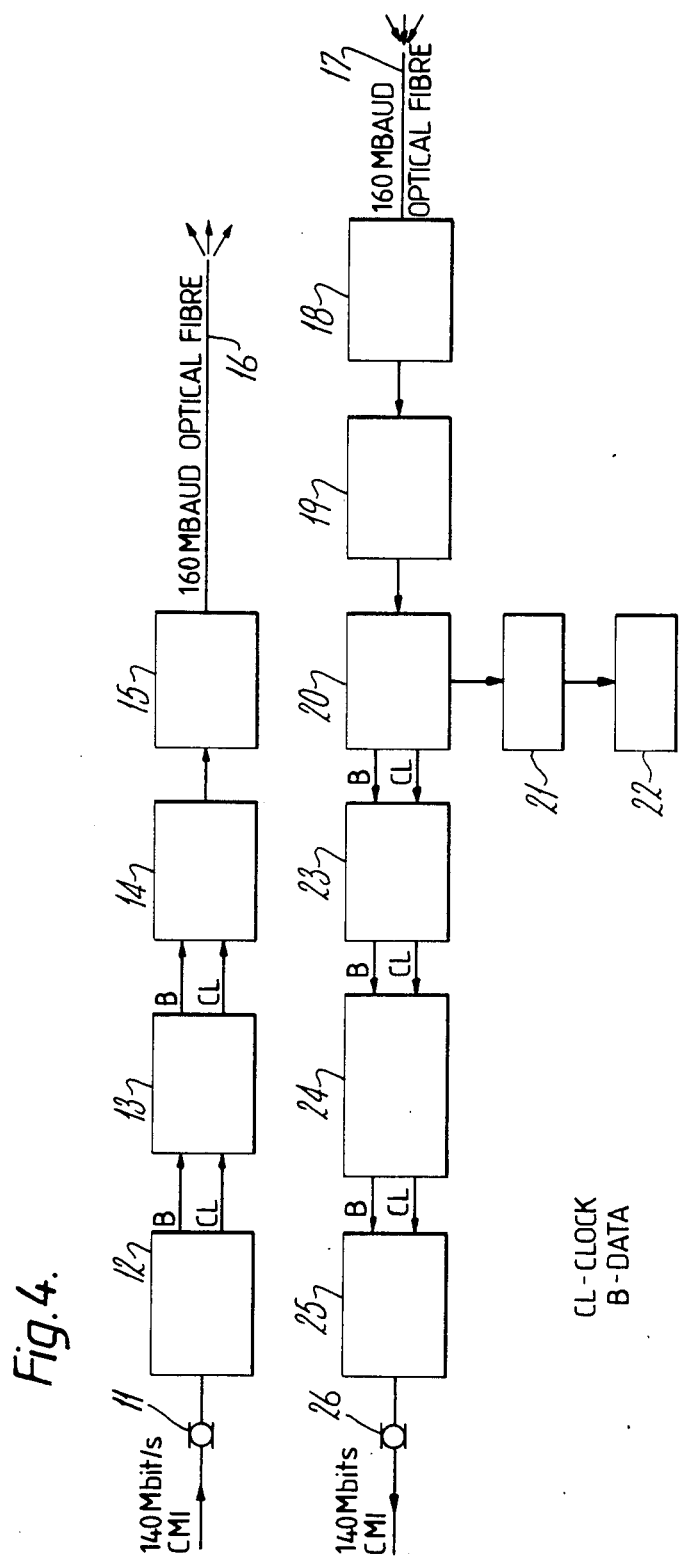
FIG. 4 is a schematic block diagram of an optical transmission system in which the interface circuit of the present invention may be employed.

The interface circuit of the present invention was originally intended for application in a 140 Mbit/s optical transmission system in order to interface an extracted clock to ECL logic, and was developed in order to overcome problems caused by the high bit rate. Previous optical transmission systems employed lower bit rates. The interface circuit of the present invention can be used at every indicated CL point of the schematic block diagram of the single mode 140 Mbit/s equipment shown in FIG. 4. The input port 11 is fed with 140 Mbit/s CMI (coded mark inversion) digital signals. The incoming clock is extracted and the CMI signals converted to simple binary in converter 12. A scrambler 13 is used to ensure satisfactory transmission of all kinds of digital signal pattern. After scrambling the signal is converted to a redundant binary line code, such as 7B8B, in generator 14, which includes mark parity control. This makes it possible to detect transmission errors at a receiver by detecting digital sum violations. The 7B8B line code generator 14 raises the transmission rate to 160 Mbaud. The line coded signal drives a laser modulator 15 to provide a sequence of optical pulses for transmission via an optical cable indicated at 16.

At a terminal incoming optical signals on an optical cable 17 are detected by a PIN-FET detector 18 and regenerated in a terminal repeater 19. After regeneration the signal is translated back to the original 140 Mbit/s binary form at translator 20. The signal is examined for line errors by error monitor 21 which is employed to activate terminal alarms 22. The binary signal is then applied to a fitter reducer 23 before descrambling by descrambler 24 and finally converted to a CMI signal in binary to CMI converter 25 for application to an output port 26 and subsequent transmission as a 140 mbit/s CMI digital signal.

Figure 5:
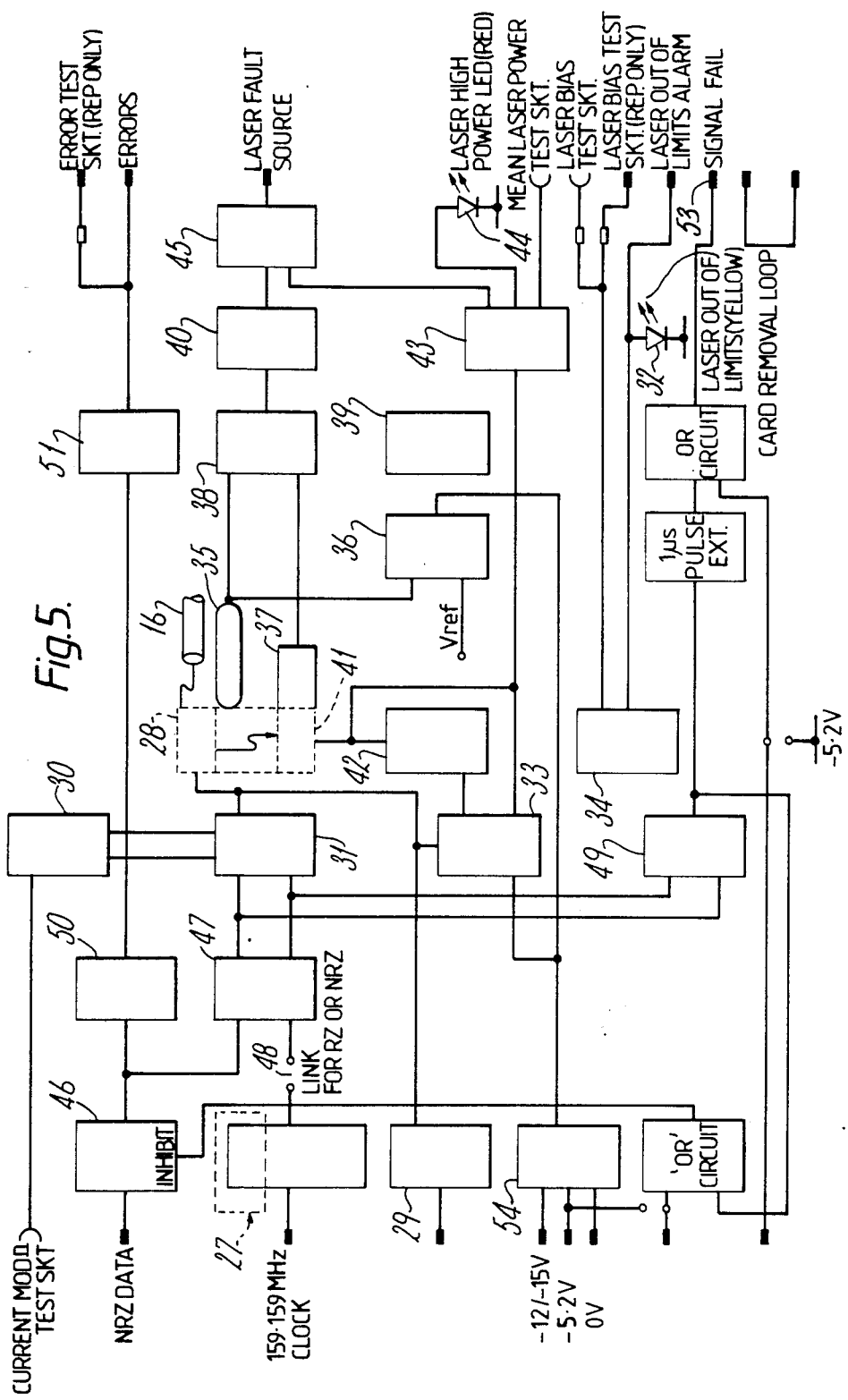
FIG. 5 is a block diagram of the laser modulator of FIG. 4.

FIG. 5 shows a typical block diagram of the laser modulator 15 indicating one of the clock interfaces 27. The laser modulator serves to drive a laser 28 to provide the 160 Mbaud optical signal for transmission via optical cable 16. All lasers exhibit a light output versus current characteristic which has a threshold current above which laser action takes place. Laser action is delayed when modulation begins significantly below this threshold. Therefore at the 140 Mbit/s rate the laser 28 is pre-biased close to the threshold by supply modulation network 29. When a small modulation current is added, such as by a laser modulation current control 30 coupled to laser current switch 1, in order to impel the optical output to the preset maximum the output increases dramatically. The threshold current varies with ambient temperature, differs from laser to laser, and increases as the laser ages. A light emitting diode (yellow) 32 is used to indicate when the threshold current has reached, for example, 150% of its initial value, when its service life is over, by way of a mean power feedback control block 33, coupled to a power supply protection block 54, and a laser bias current monitor and alarm block 34. Temperature compensation of the threshold current is obtained by means of a thermistor 35 whose output is applied to a block 36 inhibiting laser bias in case of excess temperature, and a Peltier cooler 37 with associated cooler control 38, cooler current limiter 30 and a high temperature alarm 40.

A laser emits equal amounts of light from both its front and rear facets, but only the front facet output is used for transmission. A photodetector 41 mounted near the rear facet maintains a constant output by means of a feedback loop, including a maximum power limiter 42 and the mean power feedback control block 33, that governs the maximum and minimum power levels emitted from the front facet. The laser power is monitored by a monitor and alarm block 43 which serves to illuminate a light emitting diode (red) 44 in the event of a maximum power state. The block 43 is coupled to an OR circuit 45 together with high temperature alarm 40, the occurrence of either such alarm being indicated on a laser fault indicator (not shown) coupled to the OR circuit 45. Thus the type of any laser fault can be clearly identified by means of the indicator and which if any LED is illuminated. NRZ (non-return to zero) data to be transmitted is input to a data interface block 46 and applied to laser current switch 31 via a gate 47 to which the output of clock interface and pulse width adjustment block 27 is applied, the clock being a 159.159 MHz signal, via a link 48 for RZ or NRZ. The circuit of FIG. 5 also includes a mark density detector 49 whose output may be used to inhibit the data interface block 46 and indicate signal failure at output 53, an analogue error detector 50 together with a pulse stretcher 51 which serves to indicate errors via an indicator (not shown) coupled to output 52, together with various inputs and outputs for test purposes etc.

Figure 6:
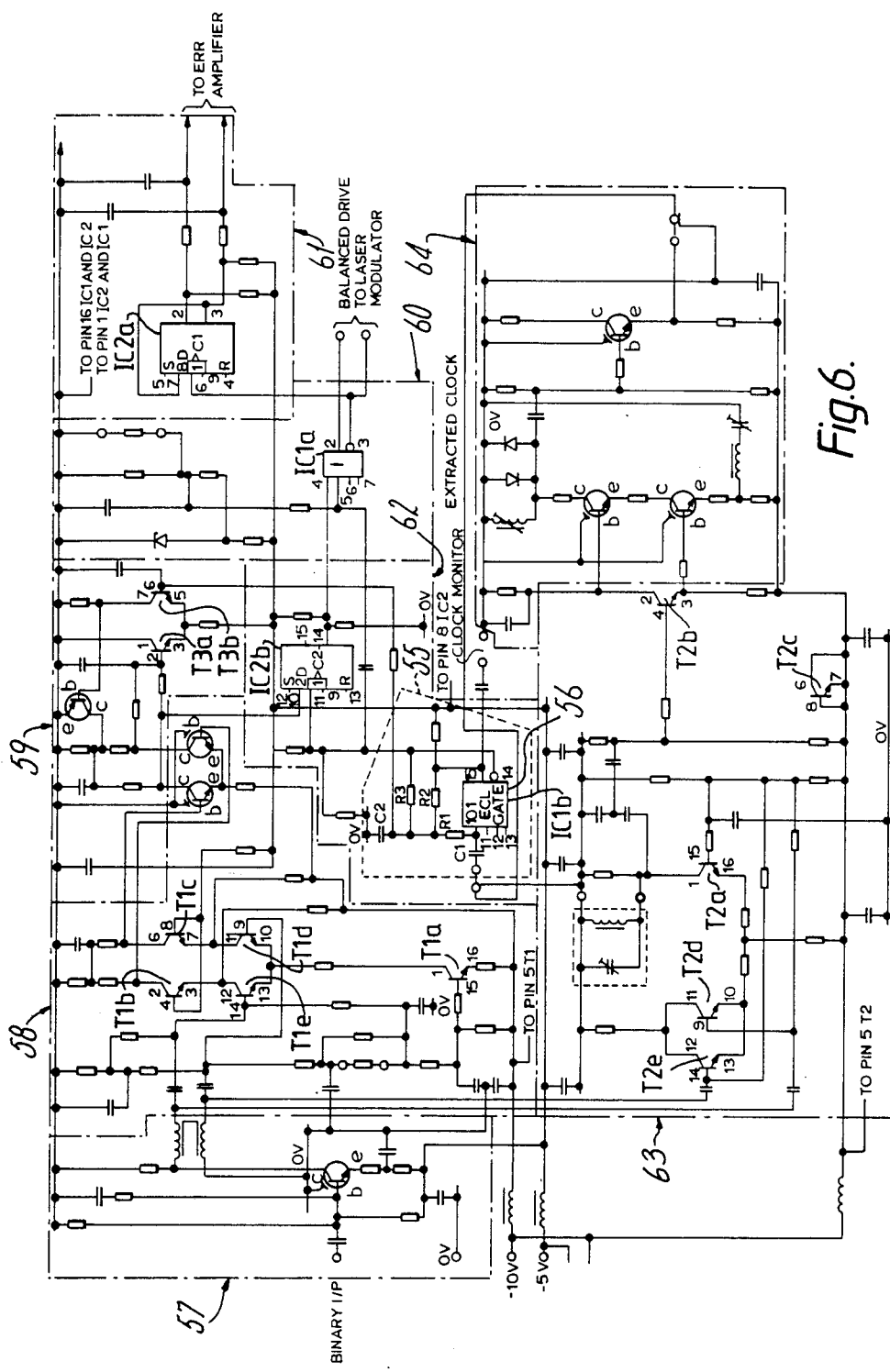
FIG. 6 is a circuit diagram of the regenerator and timing extraction functions of the optical transmission system of FIG. 4.

The circuit diagram of FIG. 6 comprises regenerator, timing and error detection functions and employs the circuit of the present invention within dashed box 55 to interface an extracted clock signal to an ECL gate 56 to provide balanced clock signals at ECL voltage levels for use elsewhere in the circuit. The equivalent components C1, C2, R1, R2 and R3 to those of FIG. 3 are indicated by the same references in FIG. 6. The circuit of FIG. 6 includes various functions, that within chain-dashed box 57 is an input buffer; that within chain-dashed box 58 is an amplitude decision circuit; that within chain-dashed box 59 is a flip-flop input d.c. control; that within chain-dashed box 60 is for pulse width control; that within chain-dashed box 61 is a parity error toggle; that within chain-dashed box 62 is a returning flip-flop which includes the circuit of the present invention within the box 55 portion thereof; that within box 63 comprises a timing rectifier; and that within box 64 comprises a clock limiter and buffer. The input buffer, amplitude decision, flip-flop d.c. control, pulse width control and retiming flip-flop (boxes 57, 58, 59, 60 and 62) together comprise the regenerator. The timing rectifier and clock limiter and buffer (boxes 63 and 64) may be referred to as the timing extraction.

The circuit of FIG. 6 is shown as comprised of discrete elements but employs three transistor arrays T1, T2 and T3 and two integrated circuits IC1 and IC2, portions of which latter are used in different functions. For correct operation of these transistor arrays and integrated circuits the stated pin interconnections are necessary. Transistor array T1 comprises five transistors T1a, T1b, T1c, T1d and T1e. Transistor array T2 similarly comprises five transistors T2a, T2b, T2c, T2d and T2e, whereas array T3 merely comprises transistors T3a and T3b. Integrated circuit IC1 comprises portions IC1a and IC1b, whereas integrated circuit IC2 comprises portions IC2a and IC2b. For correct operation of monolithic transistor arrays T1 and T2 the pin 5 of each thereof, which is a connection to the substrate of the monolithic array, must be kept at a potential more negative than any other in the array.

I claim:
1. An electrical circuit for interfacing high frequency signals to the logic levels of a logic family having a switching voltage at the mean of the voltages corresponding to the "0" and "1" logic levels, respectively, said circuit comprising:

a circuit input for connection to a source of a high frequency signal;

a logic gate having an input and a pair of complementary outputs, said logic gate input being capacitively coupled to said circuit input;

an input termination resistor having one terminal connected to said logic gate input;

a capacitor for storing a d.c. bias voltage for said logic gate input, one terminal of said capacitor being connected to the other terminal of said input termination resistor; and a pair of feedback resistors of substantially the same resistance value, each of said feedback resistors being connected between a respective one of the pair of complementary logic gate outputs and said one terminal of said capacitor;

whereby the d.c. bias voltage stored in said capacitor is maintained at the switching voltage.

2. An electrical circuit in accordance with claim 1 wherein said logic gate is of the emitter-coupled logic (ECL) family.

3. A digital telecommunications transmission equipment for signals having a bit rate in excess of 100 Mbits/sec, comprising:
 means for extracting a clock signal from a received signal;
 a digital logic processing circuit for processing a data signal, said processing circuit operating at particular logic voltage levels and having a switching voltage at the mean of the voltages corresponding to the "0" and "1" digital logic levels, respectively; and
 an interface circuit for interfacing the extracted clock signal to the logic levels of said processing circuit, said interface circuit including:
 a logic gate having an input and a pair of complementary outputs, said logic gate operating at the same logic voltage levels as said processing circuit, and said logic gate input being capacitively coupled to receive the extracted clock signal;
 an input termination resistor having one terminal connected to said logic gate input,
 a capacitor for storing a d.c. bias voltage for said logic gate input, one terminal of said capacitor being connected to the other terminal of said input termination resistor, and
 a pair of feedback resistors, each of said feedback resistors being connected between a respective one of the pair of complementary logic gate outputs and said one terminal of said capacitor,
 whereby the d.c. bias voltage stored in said capacitor is maintained at the switching voltage.

* * * * *